US010625938B2

(12) United States Patent
Horii et al.

(10) Patent No.: US 10,625,938 B2
(45) Date of Patent: Apr. 21, 2020

(54) ARTICLE TRANSPORT FACILITY

(71) Applicant: Daifuku Co., Ltd., Osaka-shi (JP)

(72) Inventors: Takahiro Horii, Hinocho (JP); Takashi Niiyama, Hinocho (JP); Kazuya Omori, Hinocho (JP)

(73) Assignee: Daifuku Co., Ltd., Osaka-shi (JP)

( * ) Notice: Subject to any disclaimer, the term of this patent is extended or adjusted under 35 U.S.C. 154(b) by 288 days.

(21) Appl. No.: 15/784,260

(22) Filed: Oct. 16, 2017

(65) Prior Publication Data

US 2018/0105361 A1 Apr. 19, 2018

(30) Foreign Application Priority Data

Oct. 19, 2016 (JP) .................................. 2016-205276

(51) Int. Cl.
*B65G 1/04* (2006.01)
*B65G 1/133* (2006.01)
(Continued)

(52) U.S. Cl.
CPC .............. *B65G 1/0407* (2013.01); *B61B 3/02* (2013.01); *B65G 1/0485* (2013.01); *B65G 1/133* (2013.01);
(Continued)

(58) Field of Classification Search
CPC .... B65G 1/0407; B65G 1/0421; B65G 1/133; B65G 1/1375; B65G 1/0485; B65G 37/02;
(Continued)

(56) References Cited

U.S. PATENT DOCUMENTS

| 2009/0016864 | A1 | 1/2009 | Yoshida et al. | |
| 2010/0307989 | A1* | 12/2010 | Hanel | B65G 1/0407 211/1.57 |
| 2010/0322748 | A1* | 12/2010 | Lee | B65G 1/02 414/281 |
| 2012/0128452 | A1 | 5/2012 | Murata et al. | |
| 2013/0209202 | A1* | 8/2013 | Schmit | B65G 1/0407 414/279 |
| 2014/0109516 | A1 | 4/2014 | Tominaga | |

(Continued)

FOREIGN PATENT DOCUMENTS

JP 2005150129 A 6/2005
JP 200722677 A 2/2007
(Continued)

*Primary Examiner* — Saul Rodriguez
*Assistant Examiner* — Ashley K Romano
(74) *Attorney, Agent, or Firm* — The Webb Law Firm

(57) ABSTRACT

An article transport facility includes an article transport vehicle, a storage rack configured to store articles, and a for-rack transport device. The article transport vehicle is configured to travel along one or more rails suspended from, and supported by, a ceiling. The storage rack is suspended from, and supported by, the ceiling. The for-rack transport device is located on an opposite side from the one or more rails with respect to the storage rack. With at least one level of the plurality of levels in at least one of the one or more vertical rows of storage locations being each designated as a carrying-in-or-out level in a corresponding vertical row, and with at least one level of the plurality of levels in at least one of the one or more vertical rows that is not a carrying-in-or-out level being each designated as a storage level in a corresponding vertical row, the article transport vehicle is configured to be capable of transferring an article to any storage location at any carrying-in-or-out level in any of the one or more vertical rows, and is configured to be incapable of transferring an article to any storage location at any storage level in any of the one or more vertical rows.

15 Claims, 6 Drawing Sheets

(51) Int. Cl.
  *B65G 1/137*   (2006.01)
  *B61B 13/06*   (2006.01)
  *B61B 3/02*    (2006.01)
  *H01L 21/677*  (2006.01)
  *B65G 37/02*   (2006.01)

(52) U.S. Cl.
  CPC ........... *B65G 1/1375* (2013.01); *B65G 37/02* (2013.01); *H01L 21/67733* (2013.01); *H01L 21/67736* (2013.01); *H01L 21/67769* (2013.01); *B61B 13/06* (2013.01); *B65G 2201/0297* (2013.01)

(58) Field of Classification Search
  CPC ... B65G 2201/0297; B61B 13/06; B61B 3/02; H01L 21/67733; H01L 21/67736; H01L 21/67769
  See application file for complete search history.

(56) References Cited

U.S. PATENT DOCUMENTS

| | | | |
|---|---|---|---|
| 2015/0110585 A1 | 4/2015 | Ota | |
| 2017/0233188 A1* | 8/2017 | Tai | B65G 1/0457 |
| | | | 414/281 |
| 2018/0076079 A1* | 3/2018 | Abe | H01L 21/67769 |
| 2018/0127212 A1* | 5/2018 | Jarvis | B65G 1/0435 |
| 2018/0297779 A1* | 10/2018 | Masuda | B65G 1/0421 |

FOREIGN PATENT DOCUMENTS

| | | |
|---|---|---|
| JP | 2008214074 A | 9/2008 |
| JP | 201040979 A | 2/2010 |
| JP | 201129550 A | 2/2011 |
| WO | 2012160917 A1 | 11/2012 |
| WO | 2013183376 A1 | 12/2013 |

* cited by examiner

ARTICLE TRANSPORT FACILITY

CROSS-REFERENCE TO RELATED APPLICATION

This application claims priority to Japanese Patent Application No. 2016-205276 filed Oct. 19, 2016, the disclosure of which is hereby incorporated in its entirety by reference.

FIELD OF THE INVENTION

The present invention relates to an article transport facility comprising an article transport vehicle configured to transport an article and a storage rack configured to store articles.

BACKGROUND

An example of such article transport facilities is described in JP Publication of Application No. 2008-214074 (Patent Document 1). In the article transport facility of Patent Document 1, an article transport vehicle (vehicle 3) travels along rails with the article transport vehicle suspended from the rails (guide rails 8) which are in turn suspended from and supported by the ceiling.

And the article transport facility of Patent Document 1 includes, as its storage, storage racks 2 and an article holding rack 1. The storage racks 2 are suspended from and supported by the ceiling and so located to be adjacent to the rails. The article holding rack 1 is installed on the floor and so located to be adjacent to the rails. The article holding rack 1 has storage locations so arranged that a plurality of storage locations are located one above another along the vertical direction.

SUMMARY OF THE INVENTION

However, the storage racks of such an article transport facility do not have a plurality of storage locations that are located one above another along the vertical direction; thus, its article storing efficiency is relatively low. In addition, the article holding storage rack of an article transport facility such as one described above has higher storing efficiency than the storage racks since the article holding rack has a plurality of storage locations that are located one above another along the vertical direction. However, there are some drawbacks arising from the fact that the article holding rack is installed on the floor, such as that the floor is required to have sufficient strength for the rack to be installed, and the portion of the floor on which the article holding rack is installed cannot be utilized for other purposes.

Thus, an article transport facility is desired in which article storage efficiency can be improved without having to install its storage on a floor portion.

An article transport facility in light of the above point comprises: an article transport vehicle configured to transport an article;
a storage rack configured to store articles;
a for-rack transport device provided separately from the article transport vehicle and configured to transport an article;
wherein the article transport vehicle is configured to travel along one or more rails with the article transport vehicle suspended from the one or more rails which are suspended from, and supported by, a ceiling, wherein the storage rack is suspended from, and supported by, the ceiling such that the storage rack is located adjacent to the one or more rails, the storage rack having storage locations each configured to store an article, the storage locations being arranged in one or more vertical rows and at a plurality of levels with one level located above another along a vertical direction, wherein the for-rack transport device is located on an opposite side from the one or more rails with respect to the storage rack, wherein, with at least one level of the plurality of levels in at least one of the one or more vertical rows of storage locations being each designated as a carrying-in-or-out level in a corresponding vertical row, and with at least one level of the plurality of levels in at least one of the one or more vertical rows that is not a carrying-in-or-out level being each designated as a storage level in a corresponding vertical row, the article transport vehicle is configured to be capable of transferring an article to any storage location at any carrying-in-or-out level in any of the one or more vertical rows, and is configured to be incapable of transferring an article to any storage location at any storage level in any of the one or more vertical rows, and wherein the for-rack transport device is configured to be capable of transporting an article between any storage location at any carrying-in-or-out level in any of the one or more vertical rows and any storage location at any storage level in any of the one or more vertical rows.

With such an arrangement, an article can be stored in the storage rack by having the article transported from outside to a storage location at a carrying-in-or-out level in a vertical row by the article transport vehicle, and by transporting the article from the storage location at the carrying-in-or-out level in the vertical row to a storage location at a storage level in a vertical row by the for-rack transport device. And an article can be retrieved from the storage rack by transporting the article from the storage location at a storage level in a vertical row to a storage location at a carrying-in-or-out level in a vertical row by the for-rack transport device, and by transporting the article from the storage location at the carrying-in-or-out level in the vertical row by the article transport vehicle.

And article storage efficiency can be improved by providing storage locations at a plurality of levels with one level located above another along the vertical direction in the storage rack. And articles transported by the article transport vehicle transports can be stored in a plurality of storage locations in the storage rack by providing the for-rack transport device. And since the storage rack is suspended from, and supported by, the ceiling, the article storage efficiency can be improved without having to install the storage rack on a floor portion.

DETAILED DESCRIPTION

1. Embodiments

Embodiments of an article transport facility are described with reference to the attached drawings.

Figure 1:
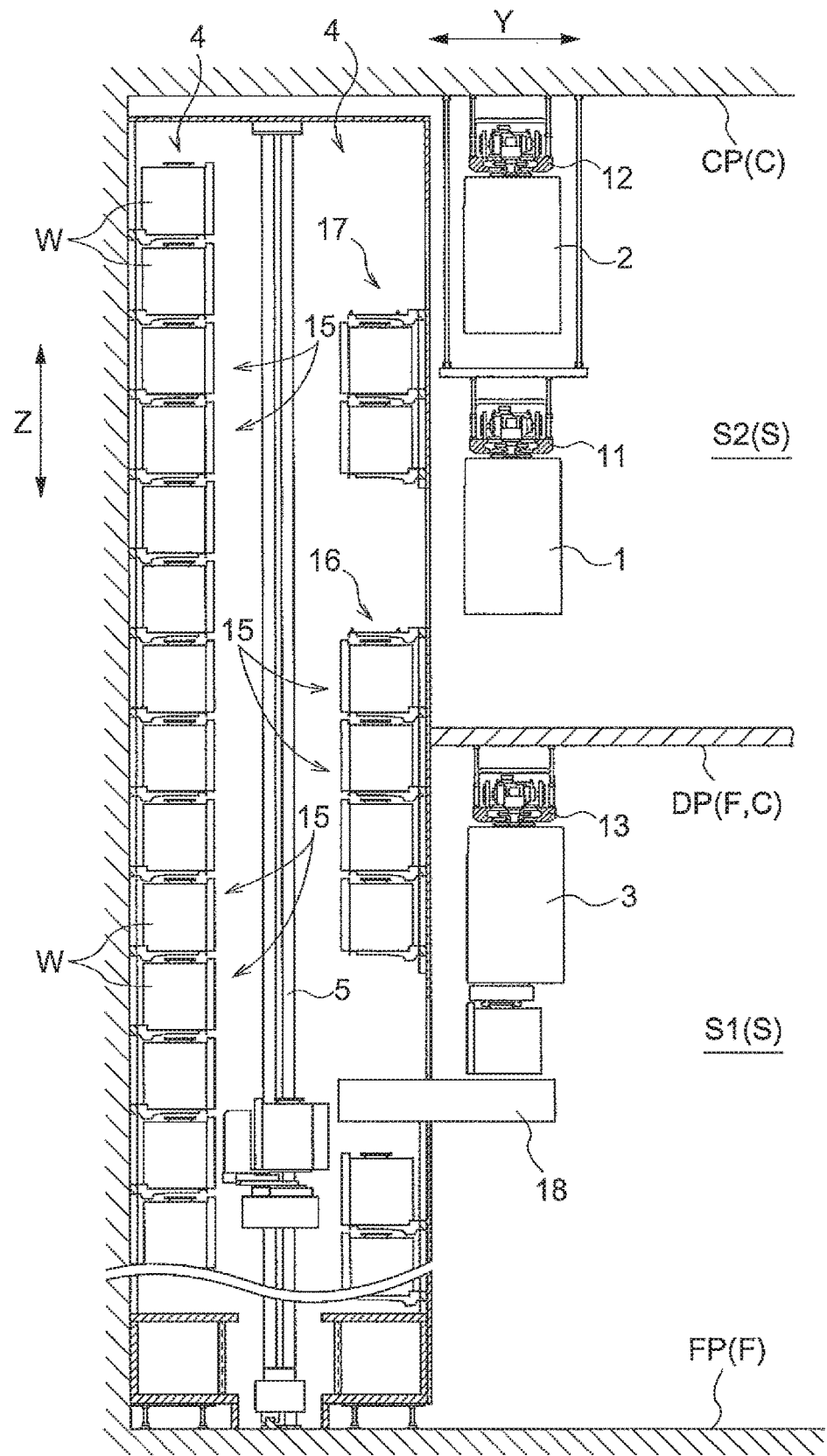
FIG. 1 is a front view of an article transport facility showing a holding rack and a transport vehicle.
Figure 2:
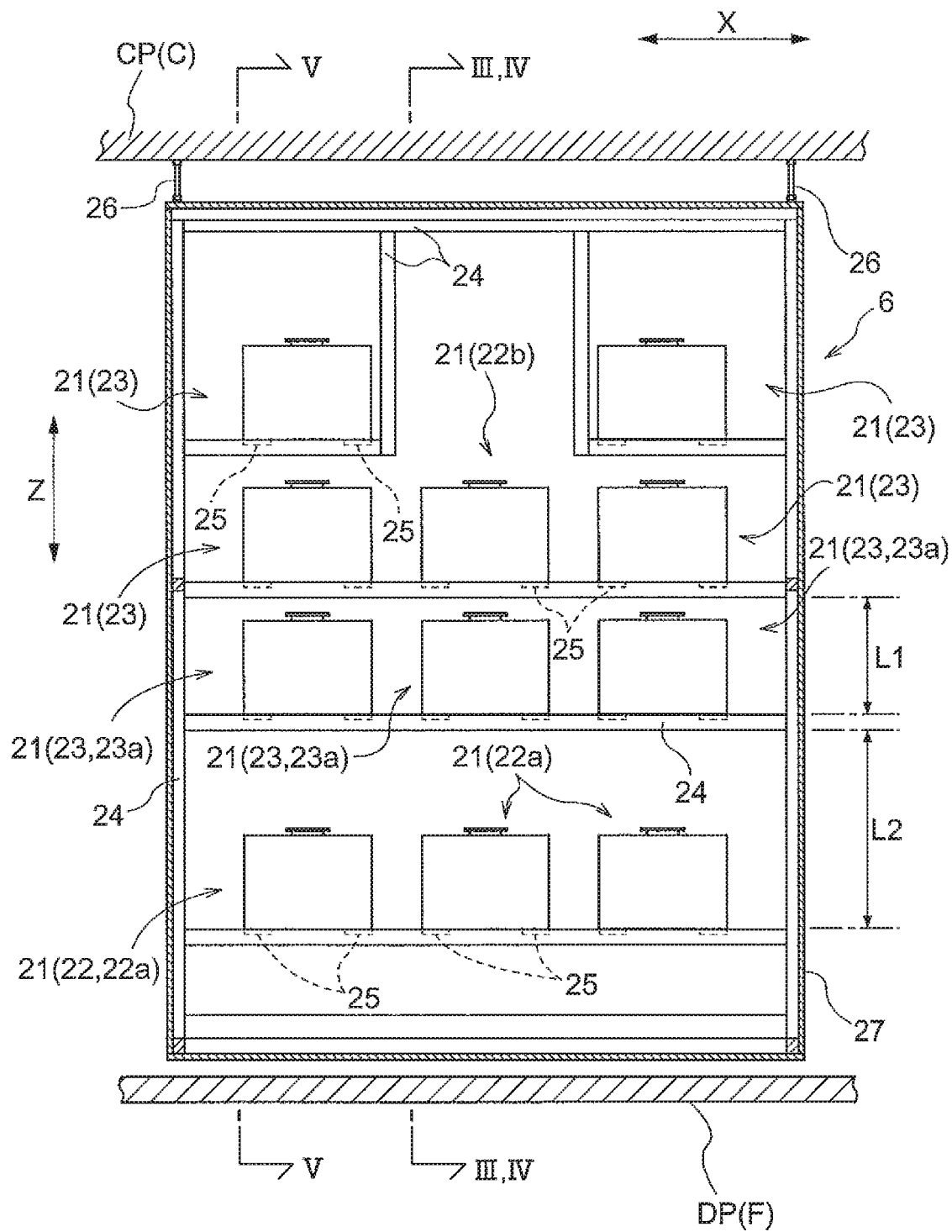
FIG. 2 is a side view of a storage rack.

As shown in FIG. 1, an article transport facility includes a first transport vehicle 1, a second transport vehicle 2, and a third transport vehicle 3, each of which is configured to transport articles W one article W at a time, holding racks 4 configured to hold or store articles W, and a stacker crane 5 configured to transport articles W, one article W at a time. As shown in FIG. 2, in addition to the first transport vehicle 1 and the second transport vehicle 2, etc., for transporting articles W, the article transport facility includes storage racks 6 each configured to store articles W, and for-rack transport devices 7, each configured to transport articles W, one article W at a time. Note that, in the present embodiment, each article W is a FOUP (Front Opening Unified Pod) for holding one or more semiconductor substrates.

Relevant components of the article transport facility are described next. In the following description, a direction along which first rails 11 (along which the first transport vehicle 1 travels) extend will be referred to as a front and back direction X (or an extending direction). And a horizontal direction that is perpendicular to the front and back direction X as seen along the vertical direction Z will be referred to as a right and left direction Y (or a perpendicular direction). In addition, the direction parallel to the right and left direction Y in which the first rails 11 and seconds rails 12 are located with respect to a given storage rack 6 will be referred to a first direction Y1 and the direction opposite to the first direction Y1 will be referred to as a second direction 2 for that storage rack 6.

As shown in FIG. 1, the article transport facility is installed in a clean room of a down-flow type in which gas/air is caused to flow downward from the ceiling side to the floor side within the space S in the clean room. A work platform portion DP on which a worker can walk is installed between a floor portion FP and a ceiling portion CP of the clean room. This work platform portion DP is installed at a vertical position that is spaced apart upward from the floor portion FP. And a first space S1 is formed between the work platform portion DP and the floor portion FP. In addition, the work platform portion DP is installed at a vertical position that is spaced apart downward from the ceiling portion CP. And a second space S2 is formed between the work platform portion DP and the ceiling portion CP. And a floor F for the first space S1 is formed by the floor portion FP whereas a ceiling C for the first space S1 is formed by the work platform portion DP. And a floor F for the second space S2 is formed by the work platform portion DP whereas a ceiling C for the second space S2 is formed by the ceiling portion CP. Thus, a portion of the space S in the clean room is divided into the first space S1 and the second space S2 by the work platform portion DP.

As shown in FIG. 1, the first transport vehicle 1 is configured to travel along the first rails 11 with the first transport vehicle 1 suspended from the first rails 11 which are in turn suspended from, and supported by, the ceiling C. The second transport vehicle 2 is configured to travel along the second rails 12 with the second transport vehicle 1 suspended from the second rails 12 which are in turn suspended from, and supported by, the ceiling C. The third transport vehicle 3 is configured to travel along the third rails 13 with the third transport vehicle 3 suspended from, and supported by, the third rails 13 which are in turn suspended from, and supported by, the ceiling C. The first rails 11 and the second rails 12 are suspended from, and supported by, the ceiling portion CP whereas the third rails 13 are suspended from, and supported by, the work platform portion DP. In other words, the first transport vehicle 1, and the second transport vehicle 2 travel in the second space S2 whereas the third transport vehicle 3 travels in the first space S1. Note that the first transport vehicle 1 is, or corresponds to, an article transport vehicle configured to transport an article W whereas the first rails 11 are, or correspond to rails suspended from, and supported by, the ceiling C.

As shown in FIG. 1, the holding racks 4 are arranged vertically on the floor portion FP (the floor F), and stand higher than the work platform D and lower than the ceiling C. The holding rack 4 has a plurality of holding locations or storage locations 15 with the holding locations arranged one next to another along the front and back direction X and one above another along the vertical direction Z. In addition, a holding rack 4 is provided with a first carrying-in-or-out port 16, a second carrying-in-or-out port 17, and a carrying-in-or-out conveyor 18. The word "or" in the expression, "carrying-in-or-out", is an inclusive "or" and may also mean "and" so that any port, device, portion, or level, with the expression "carrying-in-or-out" in the present specification and claims may be used for a carrying-in purpose, or a carrying-out purpose, or both. The first carrying-in-or-out port 16 is a port to and from which the first transport vehicle 1 can transfer an article W (for both receiving and delivering an article W). The second carrying-in-or-out port 17 is a port to and from which the second transport vehicle 2 can transfer an article W. The carrying-in-or-out conveyor 18 is such a conveyor that the third transport vehicle 3 can transfer an article W to and from a portion of the carrying-in-or-out conveyor 18 that is located directly below the third transport vehicle 3. And the stacker crane 5 is configured to transport articles W, one article W at a time, between any of the holding locations 15, the first carrying-in-or-out port 16, the second carrying-in-or-out port 17, and the carrying-in-or-out conveyor 18.

[Storage rack] As shown in FIGS. 2 through 5, the storage racks 6 are suspended from, and supported by, the ceiling portion CP (ceiling C) such that they are adjacent to the first rails 11 and the second rails 12. In addition, each storage rack 6 has storage locations 21 arranged at a plurality of levels with one level located above another along the vertical direction Z and with each storage location configured to store an article W. And storage locations 21 arranged at the plurality of levels are also arranged in vertical rows with one vertical row located next to another along the front and back direction X. As shown in FIG. 2, in the present embodiment, each storage rack 6 has storage locations 21 arranged at four levels with one level located above another along the vertical direction Z, and in three vertical rows with one vertical row located next to another along the front and back direction X.

Figure 3:
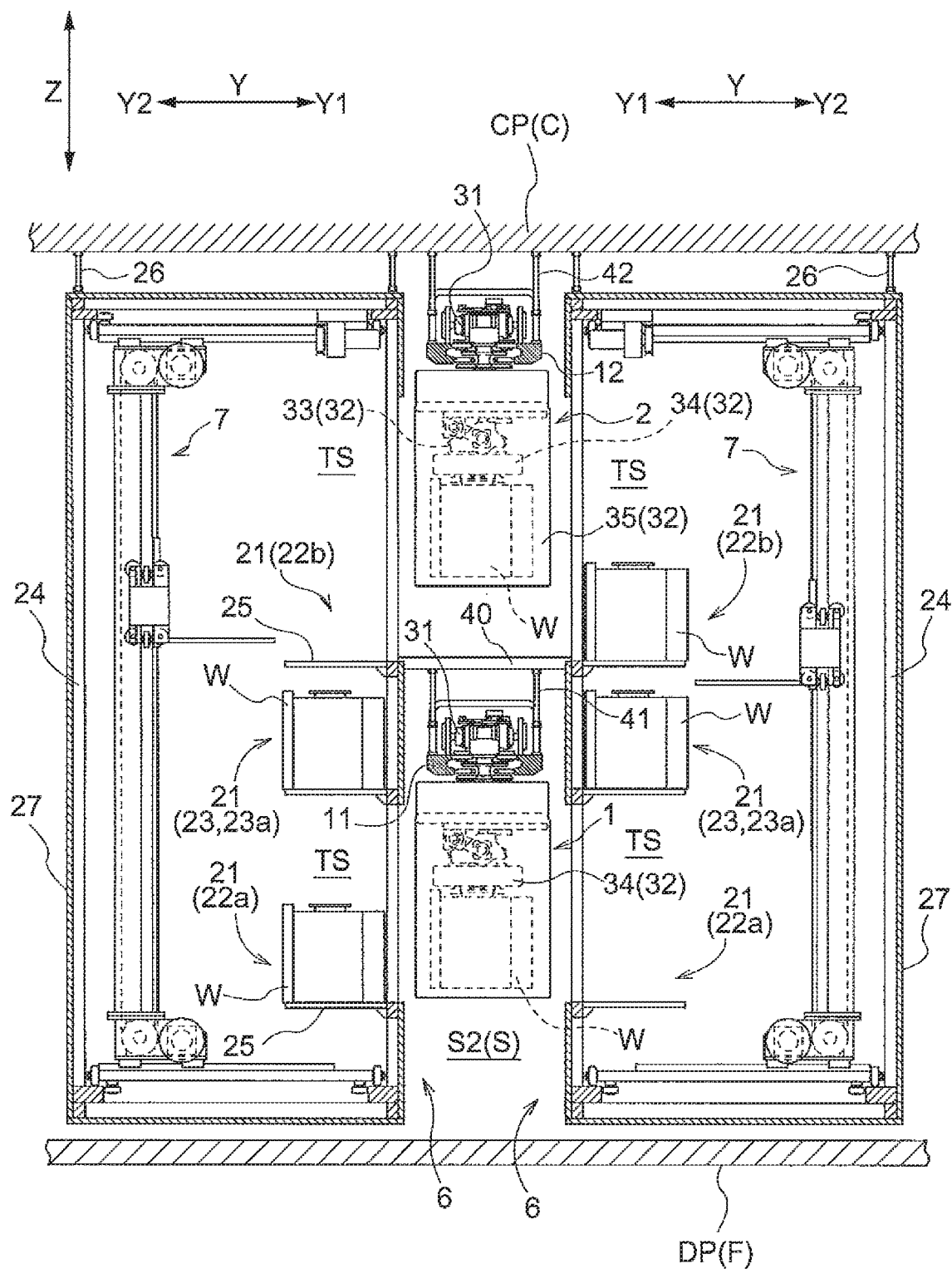
FIG. 3 is a sectional view taken at III-III in FIG. 2.
Figure 4:
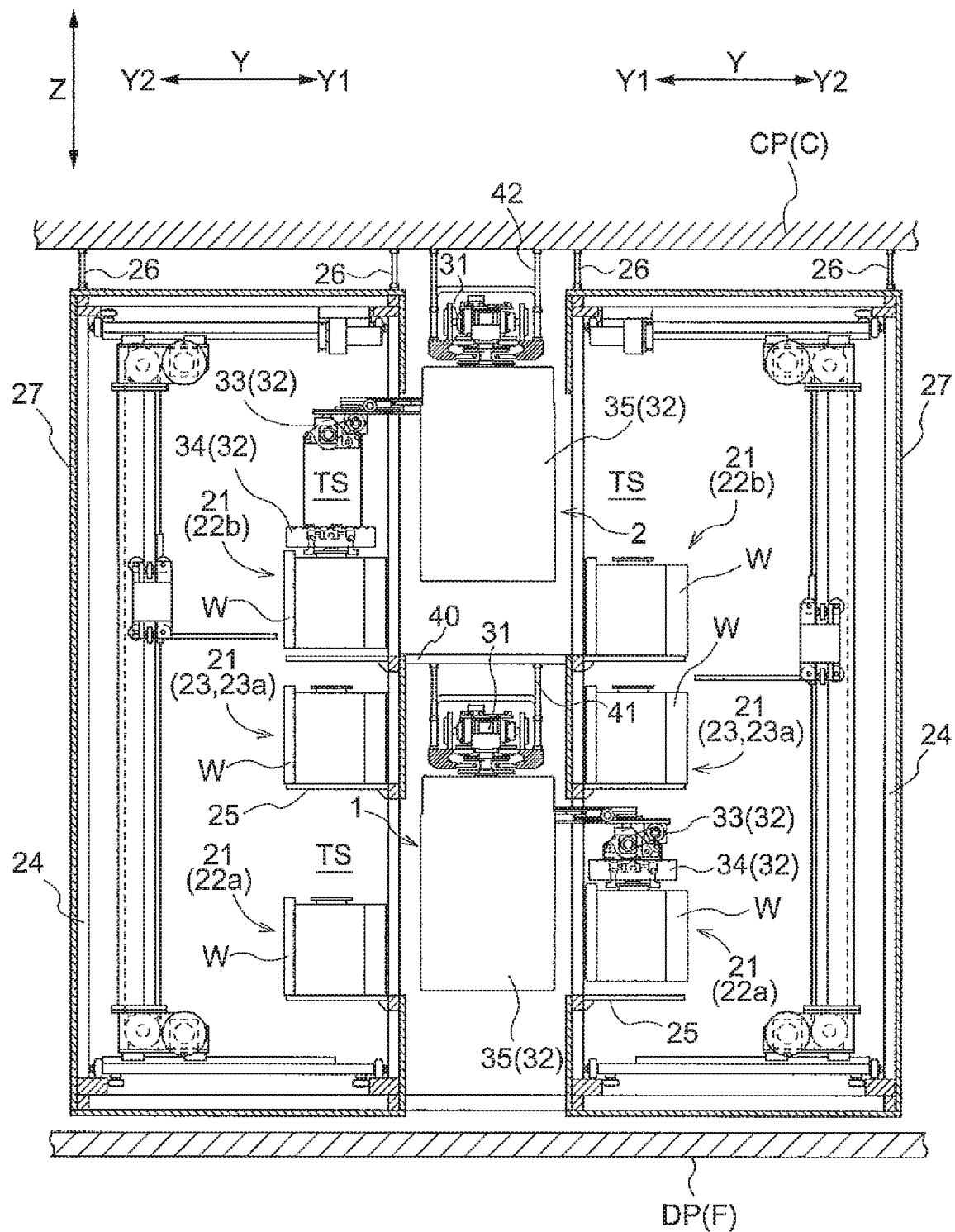
FIG. 4 is a sectional view taken at IV-IV in FIG. 2.
Figure 5:
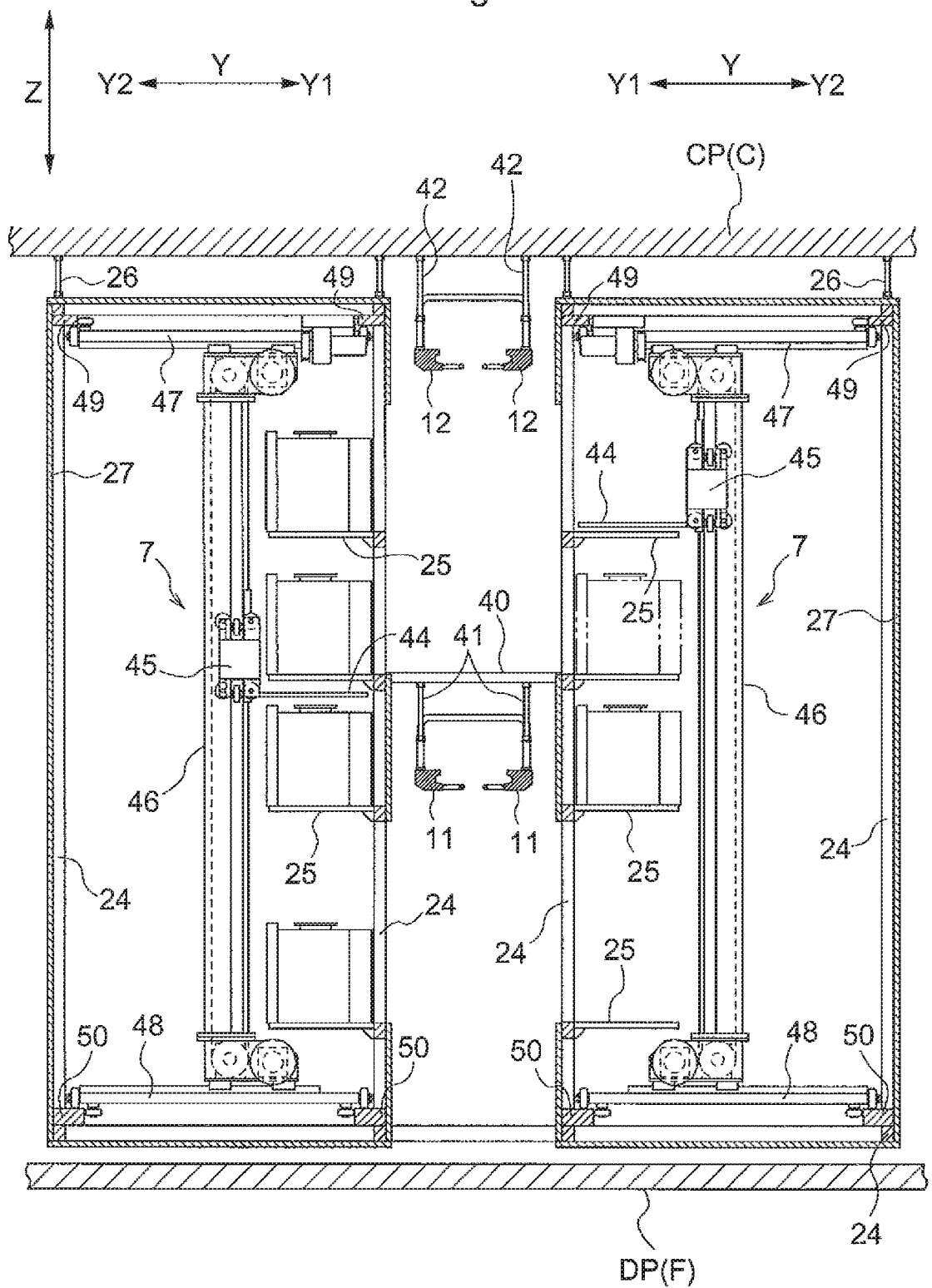
FIG. 5 is a sectional view taken at V-V in FIG. 2.

As shown in FIGS. 3 through 5, a pair of storage racks 6 are installed such that they are spaced apart from each other along the right and left direction Y and such that they face each other. The first rails 11 and the second rails 12 are installed between the pair of storage racks 6. In other words, for each of the storage racks 6 of the pair, the first rails 11 and the second rails 12 are located on the first direction Y1 side along the right and left direction Y. The storage racks 6 forming the pair are identical in structure except for the fact that they are constructed such that articles W stored in storage locations 21 in one storage rack 6 face toward a direction opposite from the articles W stored in the storage locations 21 in the other storage rack 6.

As shown in FIG. 2, the storage racks 6 are installed below the ceiling portion CP and above the work platform portion DP and thus is installed in the second space S2. And in each storage rack 6, at least one level of the plurality of levels of the storage locations 21 (i.e., at least one level of the plurality of levels at which the storage locations are located or arranged) in at least one vertical row is each designated as a first carrying-in-or-out level 22a in a corresponding row of storage locations: and at least one level in at least one vertical row that is not a first carrying-in-or-out level being each designated as a second carrying-in-or-out level 22b in a corresponding vertical row: and, each level of the plurality of levels in any vertical row that is not either a first carrying-in-or-out level 22a or a second carrying-in-or-out level 22b is designated as a storage level 23. The vertical row of storage locations 21 in the horizontally middle of the three vertical rows of storage locations 21 will be referred to as a middle vertical row and other vertical rows of storage locations 21 will be referred to as end vertical rows. Then, in the present embodiment, each end vertical row includes storage locations 21 arranged at four different levels with one level located above another along the vertical direction Z while the middle vertical row does not include the storage location 21 at the highest level included in each end vertical row, and thus includes storage locations 21 at three different levels with one located above another along the vertical direction Z. And in each end vertical row, the lowest level (of the four levels of storage locations 21 with one level located above another along the vertical direction Z) is designated as a first carrying-in-or-out level 22a whereas other levels are designated as storage levels 23. In addition, in the middle vertical row, the lowest level (of the three levels of storage locations 21 with one level located above another along the vertical direction Z) is designated as a first carrying-in-or-out level 22a: the highest level is designated as a second carrying-in-or-out level 22b: and other levels are designated as storage levels 23.

With each storage level 23 located above and vertically adjacent a first carrying-in-or-out level 22a any vertical row being referred to as a subject storage level 23a, the distance between the first carrying-in-or-out level 22a and the corresponding subject storage level 23a is greater than the distance between two storage levels 23 that are adjacent to each other along the vertical direction Z.

More specifically, the second and third levels (from the bottom) of storage levels 23 in the end vertical rows are an example of two storage levels 23 that are adjacent to each other along the vertical direction Z. Let L1 be the distance between the two storage levels 23 (or more accurately, the distance between two horizontal frame members associated with respective storage levels 23) that are adjacent to each other along the vertical direction Z (see FIG. 2). In addition, the first carrying-in-or-out level 22a at the lowest level and the subject storage level 23a at the second level (from the bottom) of in each vertical row are an example of the first carrying-in-or-out level 22a and the subject storage level 23a that are adjacent to each other along the vertical direction Z. Let L2 be the distance between the first carrying-in-or-out level 22a and the subject storage level 23a in a vertical row that are adjacent each other along the vertical direction Z (or more accurately, the distance between two horizontal frame members associated with respective levels 22a, 23a). In this case, each storage rack 6 is provided with the storage locations 21 such that the distance L2 is greater than the distance L1.

As shown in FIGS. 2 through 5, each storage rack 6 includes support members 25 each for supporting from below an article W stored in the corresponding storage location 21. Each support member 25 is fixed to a frame 24 consisting of horizontal and vertical generally bar-shaped frame members connected to one another. In addition, walls 27, that surround a space in which the storage rack 6 and the for-rack transport device 7 are installed, are fixed to the frame 24. In addition, a plurality of connecting members 26 are connected to each frame 24 and to the ceiling portion CP. Each storage rack 6 is suspended from, and supported by, the ceiling portion CP by means of the plurality of connecting members 26 such that the entire weight of each storage rack 6 is supported by the ceiling portion CP.

[Article transport vehicle] As shown in FIGS. 3 and 4, the first transport vehicle 1 includes a travel portion 31 configured to travel on and along the first rails 11, and a main body portion 32 suspended from and supported by the travel portion 31 such that the main body portion 32 is located below the first rails 11.

The main body portion 32 includes a relay portion 33 which is supported by the travel portion 31 and can be moved along the right and left direction Y with respect to the travel portion 31, an upper part support portion 34 which is supported by the relay portion 33, and which can be moved along the vertical direction Z with respect to the relay portion 33, and can support an upper part (i.e., upper portion) of an article W, and a cover member 35 which covers an area forward of, and an area backward of, an article W supported by the upper part support portion 34 located at a travel purpose position (see FIG. 3).

Figure 6:
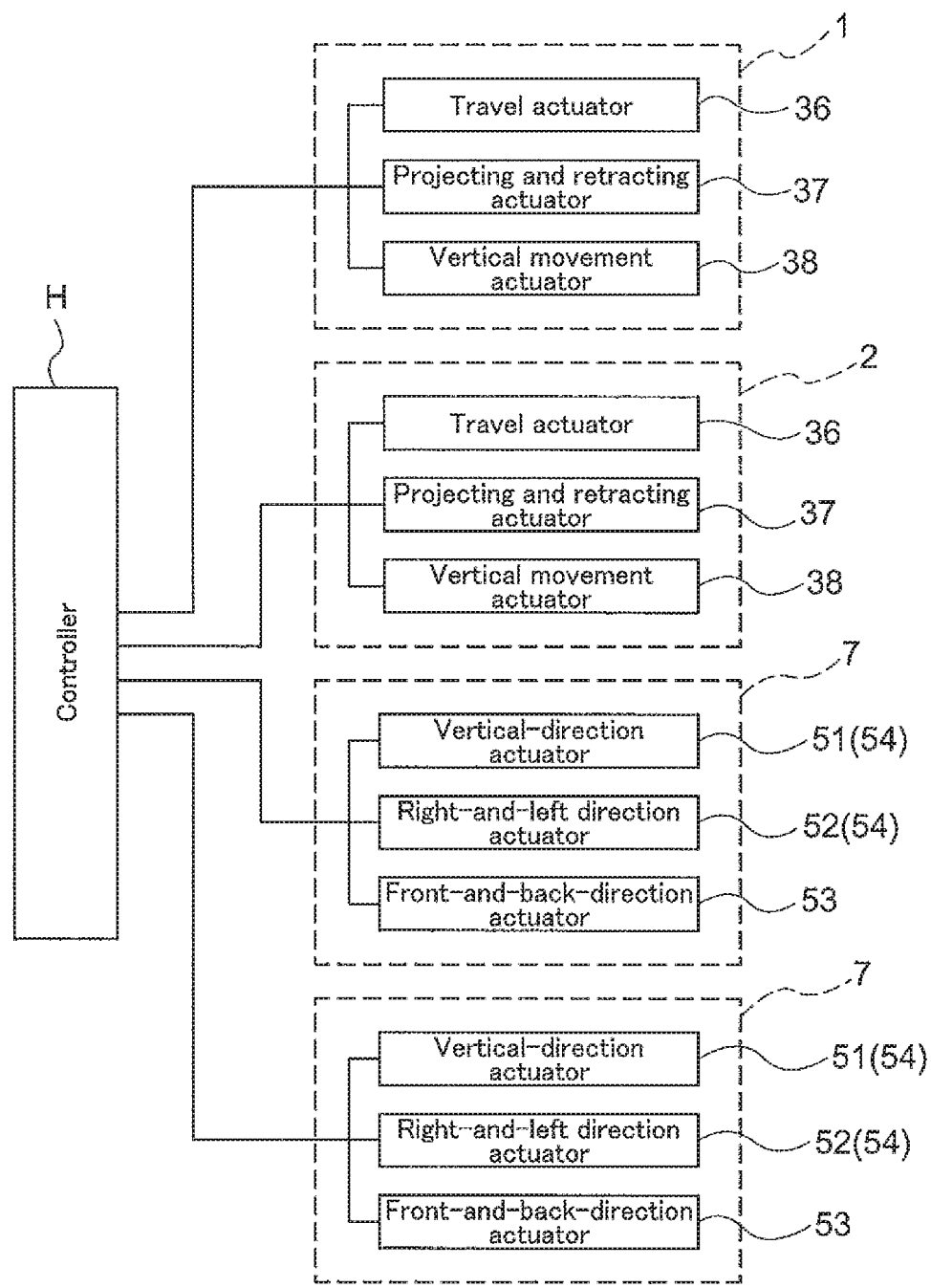
FIG. 6 is a control block diagram.

In addition, as shown in FIG. 6, the first transport vehicle 1 includes a travel actuator 36 which causes the travel portion 31 to travel along the front and back direction X, a projecting and retracting actuator 37 which moves the relay portion 33 along the right and left direction Y with respect to the travel portion 31, and a vertical movement actuator 38 which moves, or raises and lowers, the upper part support portion 34 along the vertical direction Z with respect to the relay portion 33. Each of these actuators includes an electric motor and may include any necessary gear mechanism and/or cables which may be of any conventional design. The operations of the travel actuator 36, the projecting and retracting actuator 37, and the vertical movement actuator 38 are controlled based on commands from a controller H.

Note that detailed description of the second transport vehicle 2 is omitted since the second transport vehicle 2 is identical in structure to the first transport vehicle.

As shown in FIGS. 3 through 5, the second rails 12 are located above the first rails 11 and overlap with the first rails 11 as seen along the vertical direction Z at least in an area adjacent to the storage racks 6. Thus, the first transport vehicle 1 travels along the front and back direction X at a height below the second transport vehicle 2.

And, as shown in FIG. 3, the first transport vehicle 1 travels at such a height that, when an article W is supported by the relay portion 33, the upper part support portion 34, and the upper part support portion 34 in a travel state in which the relay portion 33 is located at its travel purpose position and the upper part support portion 34 is located at its raised position, the article would be at a height between a first carrying-in-or-out level 22a and the corresponding subject storage level 23a that are adjacent to each other along the vertical direction Z (i.e., within the distance L1), in a vertical row. In addition, the second transport vehicle 2 travels at such a height that, when an article W is supported by the relay portion 33, the upper part support portion 34, and the upper part support portion 34 in the travel state, the article W would be at a greater height than a second carrying-in-or-out level 22b in a vertical row.

The first rails 11 are suspended from, and supported by, the ceiling C. To describe this in more detail, bridging members 40 are fixed to, and extend between, the frame 24 of one storage rack 6 of the pair of storage racks 6 and the frame 24 of the other storage rack 6 of the pair. And first rail connecting members 41 are connected to both corresponding first rails 11 and a corresponding bridging member 40. Thus, entire weight of the first rails 11 is supported by ceiling portion CP through the bridging members 40 and the storage racks 6. In addition, the entire weight of the first transport vehicle 1 which travels on the first rails 11 is also supported by the ceiling portion CP through the storage racks 6.

In addition, the second rails 12 are suspended from, and supported by, the ceiling C. To describe it in more detail, second rail support members 42 are connected to both corresponding second rails 12 and the ceiling portion CP. Thus, the entire weight of the second rails 12 are supported by the ceiling portion CP and the entire weight of the second transport vehicle 2 which travels on the second rails 12 are also supported by the ceiling portion CP.

As shown in FIGS. 3 and 4, the first transport vehicle 1 transfers an article W by making use of a transfer space TS formed above the storage locations 21 at the first carrying-in-or-out level 22a in corresponding vertical rows. When an article W is assumed to be stored at a first carrying-in-or-out level 22a in at least one vertical row, the transfer space TS is formed by a gap formed between the article W and a corresponding subject storage level 23a in the at least one vertical row. The second transport vehicle 2 transfers an article W by making use of a transfer space TS which is formed above a storage location 21 at the second carrying-in-or-out level 22b in at least one vertical row. There is no storage level 23 provided above the second carrying-in-or-out level 22b, and the transport space TS is formed above an article W assumed to be stored in the second carrying-in-or-out level 22b.

The first transport vehicle 1 travels in the travel state in which the relay portion 33 is located at the travel purpose position, and the upper part support portion 34 is located at its raised position. And when the first transport vehicle 1 transfers (more specifically, delivers) an article W to a storage location 21 at a first carrying-in-or-out level 22a in a vertical row, the relay portion 33 located at its travel purpose position is caused to move in the first direction Y1 along the right and left direction Y to a transfer purpose position while the travel portion 31 is located at a position that corresponds to the storage location 21 at the first carrying-in-or-out level 22a in that vertical row. By locating the relay portion 33 at a transfer purpose position, the relay portion 33 as well as the upper part support portion 34 supporting the article W enter the transfer space TS. And the article W is transferred to the storage location 21 at the first carrying-in-or-out level 22a in the vertical row by lowering the upper part support portion 34 from its raised position. Subsequently, the upper part support portion 34 is raised to its raised position and the relay portion 33 is moved to its travel purpose position to have the first transport vehicle 1 in its travel state. The first transport vehicle 1 transfers (more specifically, receives) an article W from a storage location 21 at the first carrying-in-or-out level 22a in a vertical row by performing, in reverse order, the steps taken for the first transport vehicle 1 to transfer an article W to a storage location 21 at the first carrying-in-or-out level 22a in a vertical row.

In addition, the second transport vehicle 2 transfers an article W to and from a storage location 21 at a second carrying-in-or-out level 22b in a vertical row by taking the same steps taken by the first transport vehicle 1.

Because the first transport vehicle 1 transfers an article W by making use of the transfer space TS formed above a storage location 21 at a first carrying-in-or-out level 22a in a vertical row, the first transport vehicle 1 is configured to be capable of transferring an article to and from any of such storage locations 21 (each located at a first carrying-in-or-out level 22a in a vertical row) above which the transfer space TS is formed as described above. In addition, the first transport vehicle 1 is configured to be incapable of transferring an article W to or from any storage location 21 at a storage level 23 in any vertical row or any storage location 21 at a second carrying-in-or-out level 22b in any vertical row because no space that is as large as the transfer space TS is formed above a storage location 21 at any storage level 23 in any vertical row, and because any transfer space TS is displaced along the vertical direction Z from the height at which the relay portion 33 projects and retracts.

In addition, as with the first transport vehicle 1, the second transport vehicle 2 is configured to be capable of transferring an article W to and from any storage location 21 at a second carrying-in-or-out level 22b in any vertical row but is configured to be incapable of transferring an article W to or from any storage location 21 at a storage level 23 in any vertical row, or any storage location 21 at a first carrying-in-or-out level 22a in any vertical row.

[For-rack transport device] As shown in FIG. 5, each for-rack transport device 7 is located on the second direction Y2 side of, or with respect to, the corresponding storage rack 6. Each of the pair of for-rack transport device 7 is configured to be capable of transporting articles W, one article W at a time, between any storage location 21 at a first carrying-in-or-out level 22a in any vertical row, any storage location 21 at a second carrying-in-or-out level 22b in any vertical row, and any storage location 21 at each storage level 23 in any vertical row (i.e., between any two storage locations in the corresponding rack 6). And each for-rack transport device 7 includes a bottom support portion 44 which is generally plate-shaped and supports a bottom portion of an article W from below (with generally plate-shaped means generally flat and thin (vertical dimension is less than horizontal dimensions)), a movable member 45 to which an end portion (on the second direction Y2 side) of the bottom support portion 44 is connected to support the bottom support portion 44, a vertical guide member 46 for guiding the movable member 45 along the vertical direction Z, a first right-and-left-direction guide member 47 for guiding an upper portion of the vertical guide member 46 along the right and left direction Y, a second right-and-left-direction guide member 48 for guiding a lower portion of the vertical guide member 46 along the right and left direction Y, a first front-and-back-direction guide member 49 for guiding the first right-and-left-direction guide member 47 along the front and back direction X, and a second front-and-back-direction guide member 50 for guiding the second right-and-left-direction guide member 48 along the front and back direction X.

Each for-rack transport device 7 is suspended from, and supported by, the ceiling C. To describe it in more detail, each of the first front-and-back-direction guide member 49 and the second front-and-back-direction guide member 50 is a generally rail-shaped member installed along the front and back direction (with "generally rail-shaped member" meaning a member having a generally flat and elongate contact surface), and is fixed to the frame 24 of the storage rack 6. Thus, the entire for-rack transport device 7 (which includes the bottom support portion 44, the movable member 45, the vertical guide member 46, the first right-and-left-direction guide member 47, the second right-and-left-direction guide member 48, the first front-and-back-direction guide member 49, and the second front-and-back-direction guide member 50) is supported by the storage rack 6;

thus, the entire weight of each for-rack transport device 7 is supported by the ceiling portion CP through the corresponding storage rack 6.

In addition, as shown in FIG. 6, each for-rack transport device 7 includes a vertical-direction actuator 51 which moves the movable member 45 along the vertical guide member 46 and thus along the vertical direction Z, a right-and-left-direction actuator 52 which moves the vertical guide member 46 along the first right-and-left-direction guide member 47 and the second right-and-left-direction guide member 48 and thus along the right and left direction Y, and a front-and-back-direction actuator 53 which moves the first right-and-left-direction guide member 47 along the first front-and-back-direction guide member 49 and thus along the front and back direction X and which also moves the second right-and-left-direction guide member 48 along the second front-and-back-direction guide member 50 and thus along the front and back direction X. Each of these actuators includes an electric motor and may include any necessary cable and pulley mechanism and/or gear mechanism which may be of any conventional design. The actuator 54 configured to move the bottom support portion 44 along the vertical direction Z and along the right and left direction Y is formed by the vertical-direction actuator 51 and the right-and-left-direction actuator 52. Operations of these vertical-direction actuators 51, the right-and-left-direction actuator 52, and the front-and-back-direction actuator 53 are controlled based on commands from the controller H.

And the bottom support portion 44 can be moved along the vertical direction Z by vertically moving the movable member 45 with the vertical-direction actuator 51. The bottom support portion 44 can be moved along the right and left direction Y and to a retracted position and to a projected position, by moving the vertical guide member 46 along the right and left direction Y with the right-and-left-direction actuator 52. The retracted position is a position at which the bottom support portion 44 is displaced (in the displaced state) in the second direction Y2 relative to the storage rack 6 whereas the projected position is a position at which the bottom support portion 44 is displaced (i.e., in the displaced state) in the first direction Y1 relative to the retracted position. The bottom support portion 44 can be moved along the front and back direction X by moving the first right-and-left-direction guide member 47 and the second right-and-left-direction guide member 48 together along the front and back direction X with the front-and-back-direction actuator 53.

Each for-rack transport device 7 transports an article W by making use of a space formed under storage locations 21 at a given level. Since the bottom support portion 44 of each for-rack transport device 7 for supporting an article W is generally plate-shaped, the for-rack transport device 7 can transport an article, even if the space is narrow along the vertical direction Z. Thus, each for-rack transport device 7 is configured to be capable of transferring an article W to and from any storage location 21 at a first carrying-in-or-out level 22a, any storage location 21 at a second carrying-in-or-out level 22b, and any storage location 21 at a storage level 23, in any vertical row.

As shown in FIG. 2, when a for-rack transport device 7 transports an article W from a storage location 21, the for-rack transport device 7 moves, as the first step, its bottom support portion 44 along the vertical direction Z and the front and back direction X to a position that corresponds to the storage location 21. Next, the for-rack transport device 7 moves the bottom support portion 44 from the retracted position to the projected position to cause the bottom support portion 44 to enter the space formed under the storage location 21. Subsequently, the for-rack transport device 7 moves the bottom support portion 44 upward to pick up the article W. Subsequently, the for-rack transport device 7 moves the bottom support portion 44 to its retracted position.

The for-rack transport device 7 transports an article W to a storage location 21 by performing, in the reverse order, the steps taken to transport an article W from a storage location 21. And by performing such a transport operation of an article W from a storage location 21 and a transport operation of an article W to a storage location 21, the for-rack transport device 7 transports an article W from a storage location 21 (i.e., any storage location 21 at a first carrying-in-or-out level 22a, any storage location 21 at a second carrying-in-or-out level 22b, and any storage location 21 at a storage level 23, in any vertical row) to another storage location 21 (i.e., any storage location 21 at at a first carrying-in-or-out level 22a, any storage location 21 at a second carrying-in-or-out level 22b, and any storage location 21 at a storage level 23, in any vertical row). As such, each for-rack transport device 7 transports articles W, one article W at a time, between any storage location 21 at a first carrying-in-or-out level 22a, any storage location 21 at a second carrying-in-or-out level 22b, and any storage location 21 at a storage level 23 (i.e., between any two storage locations in the corresponding rack 6).

2. Other Embodiments

Other embodiments of an article transport facility are described next.

(1) In the embodiment described above, each of the first transport vehicle 1 and the second transport vehicle 2 includes an upper part support portion 34 for supporting an upper portion of an article W and thus is configured to transport an article W with the article W suspended from and supported by upper part support portion. However, the arrangement in the first transport vehicle 1 and the second transport vehicle 2 for supporting an article W may be changed or modified suitably. More specifically, each of the first transport vehicle 1 and the second transport vehicle 2 may include a support portion which can support a bottom portion of an article W and thus may be configured to transport an article W with the article W placed on, and supported by, the support portion.

In addition, each for-rack transport device 7 includes a bottom support portion 44 for supporting the bottom portion of an article W and is configured to transport the article W with the article W placed on and supported by the bottom support portion 44. However, the arrangement for supporting an article W in the for-rack transport device 7 may be changed or modified suitably. More specifically, each for-rack transport device 7 may include a support portion for supporting an upper portion of an article W and thus may be configured to transport an article W with the article W suspended from, and supported by, the support portion. In addition, each for-rack transport device 7 is suspended from, and supported by, the ceiling C in the embodiment described above. However, the for-rack transport device 7 may be supported by the floor F.

(2) In the embodiment described above, the first transport vehicle 1 and the second transport vehicle 2 are provided. However, only the first transport vehicle 1 of the two vehicles 1, 2 may be provided. In this case, it is not necessary to provide any second carrying-in-or-out level 22b. At least one of the plurality of levels in at least one vertical row at which the storage locations 21 are located may be each designated as a first carrying-in-or-out level 22a (carrying-in-or-out portion) in a corresponding row whereas each of all other levels in any vertical row that is not a carrying-in-or-out level 22a may be designated as a storage level 23.

(3) In the embodiment described above, each storage rack 6 includes storage locations 21 arranged at four different levels and in three vertical rows. However, the number of levels and vertical rows of the storage locations 21 provided to any of the storage racks 6 may be changed as desired. More specifically, for example, one vertical row, two vertical rows, or more than four vertical rows, of storage locations 21 may be provided along the front and back direction X. And the storage locations 21 may be arranged at a single level, at two different levels, three different levels, or five or more different levels along the vertical direction Z. In addition, the positions and the number of first carrying-in-or-out levels 22a, the second carrying-in-or-out levels 22b, and the storage levels 23 in any vertical row in a storage rack 6 may be changed as desired. For example, the lowest level in the middle vertical row and each of two end vertical rows is designated as the first carrying-in-or-out level 22a in the embodiment described above. However, only the lowest level in the middle vertical row may be designated as a first carrying-in-or-out level 22a.

(4) In the embodiment described above, the distance between a first carrying-in-or-out level 22a and a corresponding subject storage level 23a (or more accurately the distance between the horizontal frame members associated with these levels 22a, 23a) is greater than the distance between two storage levels 23 that are adjacent to each other along the vertical direction Z (or more accurately the distance between the horizontal frame members associated with these storage levels 23). However, the distance between a first carrying-in-or-out level 22a and a corresponding subject storage level 23a (or more accurately the distance between the horizontal frame members associated with these levels 22a, 23a) may be the same as, or less than, the distance between two storage levels 23 that are adjacent each other along the vertical direction Z (or more accurately the distance between the horizontal frame members associated with these storage levels 23).

(5) In addition, an arrangement disclosed in any of the embodiments described above can also be used in combination with any arrangement disclosed in any other embodiment unless inconsistency arises. Regarding any other arrangements and features, the embodiments disclosed in the present description are provided for the purposes of illustration only regarding all aspects. Therefore, it is possible to make various suitable changes without departing from the spirit of the present disclosure.

3. Summary of Embodiments Described Above a Brief Summary of the Article Transport Facility Described Above is Provided Next A article transport facility comprises: an article transport vehicle configured to transport an article;
a storage rack configured to store articles;
a for-rack transport device provided separately from the article transport vehicle and configured to transport an article;
wherein the article transport vehicle is configured to travel along one or more rails with the article transport vehicle suspended from the one or more rails which are suspended from, and supported by, a ceiling, wherein the storage rack is suspended from, and supported by, the ceiling such that the storage rack is located adjacent to the one or more rails, the storage rack having storage locations each configured to store an article, the storage locations being arranged in one or more vertical rows and at a plurality of levels with one level located above another along a vertical direction, wherein the for-rack transport device is located on an opposite side from the one or more rails with respect to the storage rack, wherein, with at least one level of the plurality of levels in at least one of the one or more vertical rows of storage locations being each designated as a carrying-in-or-out level in a corresponding vertical row, and with at least one level of the plurality of levels in at least one of the one or more vertical rows that is not a carrying-in-or-out level being each designated as a storage level in a corresponding vertical row, the article transport vehicle is configured to be capable of transferring an article to any storage location at any carrying-in-or-out level in any of the one or more vertical rows, and is configured to be incapable of transferring an article to any storage location at any storage level in any of the one or more vertical rows, and wherein the for-rack transport device is configured to be capable of transporting an article between any storage location at any carrying-in-or-out level in any of the one or more vertical rows and any storage location at any storage level in any of the one or more vertical rows.

With such an arrangement, articles can be stored in various locations of the storage rack with improved efficiency by having an article transported from outside to a storage location at a carrying-in-or-out level in a vertical row by the article transport vehicle, and by transporting the article from the storage location at the carrying-in-or-out level in the vertical row to a storage location at a storage level in a vertical row by the for-rack transport device. And an article can be retrieved from any desired location of the storage rack by transporting the article from the storage location at a storage level in a vertical row to a storage location at a carrying-in-or-out level in a vertical row by the for-rack transport device, and by transporting the article from the storage location at the carrying-in-or-out level in the vertical row by the article transport vehicle.

And article storage efficiency can be improved by providing storage locations at a plurality of levels with one level located above another along the vertical direction in the storage rack. And articles transported by the article transport vehicle transports can be stored in a plurality of storage locations in the storage rack by providing the for-rack transport device. And since the storage rack is suspended from, and supported by, the ceiling, the article storage efficiency can be improved without having to install the storage rack on a floor portion.

Here, at each of the plurality of levels, the storage rack preferably includes a plurality of storage locations arranged along an extending direction along which the one or more rails extend.

With the arrangement described above, because a plurality of storage locations are provided and arranged along an extending direction, an increased number of storage locations can be provided;
thus the number of articles that can be stored in the storage rack can be increased.

In addition, with a storage level in any of the one or more vertical rows that is above, and adjacent to, a carrying-inor-out level along the vertical direction being each defined as a subject storage level in a corresponding vertical row, a distance between a height associated with a carrying-in-or-out level and a height associated with a corresponding subject storage level is preferably greater than a distance between two heights associated with respective storage levels that are adjacent to each other along the vertical direction.

With the arrangement described above, since the distance between a height associated with a carrying-in-or-out level and a height associated with a corresponding subject storage level is relatively large, it becomes easier to transfer an article to a storage location at the carrying-in-or-out level with the article transport vehicle by making use of this relatively large distance. In addition, by having a relatively narrow distance between two storage locations that are adjacent to each other along the vertical direction, it is made easier to make smaller the vertical dimension of the article storage rack.

In addition, the for-rack transport device is preferably suspended from, and supported by, the ceiling.

With the arrangement described above, by suspending and supporting the for-rack transport device from the ceiling, the for-rack transport device can be so located to be spaced apart upward from the floor. Thus, any issues that arise from installing the for-rack transport device on the floor can be avoided.

In addition, with an extending direction being defined as a direction along which the one or more rails extend, and with a perpendicular direction being defined as a direction that is perpendicular to the extending direction as seen along the vertical direction, the article transport vehicle preferably includes a travel portion configured to travel on, and along, the one or more rails, a relay portion which is supported by the travel portion and is capable of being moved along the perpendicular direction with respect to the travel portion, and an upper part support portion which is supported by the relay portion, and which is capable of being moved along the vertical direction with respect to the relay portion, and is configured to support an upper portion of an article, wherein the for-rack transport device preferably includes a generally plate-shaped bottom support portion configured to support a bottom portion of an article from below, and an actuator configured to move the bottom support portion, and wherein the actuator preferably moves the bottom support portion along the vertical direction and along the perpendicular direction.

With the arrangement described above, by traveling by means of the travel portion with the relay portion located near the travel portion and the upper part support portion located near the relay portion, the article transport vehicle can travel in a state of having relatively small dimensions along the vertical direction and the perpendicular direction. And the article transport vehicle, with the travel portion stopped at a position that corresponds to a storage location at a carrying-in-or-out level, the upper part support portion is moved downward with respect to the travel portion after the relay portion is moved toward the storage rack along the perpendicular direction with respect to the travel portion to transfer an article supported by the upper part support portion to the storage location at a carrying-in-or-out level. Since the bottom support portion of the for-rack transport device for supporting an article is generally plate-shaped, it can be made difficult for the bottom support portion to interfere with any part of the storage rack or with any article stored in the storage rack when moving an article along a perpendicular direction with the actuator.

With the one or more rails being one or more first rails, each carrying-in-or-out level in any of the one or more vertical rows being a first carrying-in-or-out level in a corresponding vertical row, and the article transport vehicle configured to travel along the one or more first rails being a first transport vehicle, the article transport facility preferably further comprises one or more second rails that are suspended from, and supported by, the ceiling, in addition to the one or more first rails, and a second transport vehicle which is an article transport vehicle configured to travel along the one or more second rails, wherein the one or more second rails are preferably so located to overlap with the one or more first rails as seen along the vertical direction in an area adjacent to the storage rack, wherein, with at least one level of the plurality of levels in at least one of the one or more vertical rows of storage locations being each designated as a first carrying-in-or-out level in a corresponding row, and at least one level of the plurality of levels in at least one of the one or more vertical rows of storage locations that is not a first carrying-in-or-out level being each designated as a second carrying-in-or-out level in a corresponding row, and each of the plurality of levels in any of the one or more vertical rows that is not a first carrying-in-or-out level or a second carrying-in-or-out level being designated as a storage level in a corresponding row, a second transport vehicle is preferably configured to be capable of transferring an article to any storage location at any second carrying-in-or-out level in any of the one or more vertical rows, and is preferably configured to be incapable of transferring an article to any storage location at any level in any of the one or more of the vertical rows that is not a second carrying-in-or-out level in any of the one or more vertical rows, wherein the for-rack transport device is preferably configured to be capable of transporting an article between any storage location at any first carrying-in-or-out level in any of the one or more vertical rows, any storage location at any second carrying-in-or-out level in any of the one or more vertical rows, and any storage location at any storage level in any of the one or more vertical rows.

With the arrangement described above, for example, an article can be delivered from the first transport device to the second transport device by transporting the article to a storage location at a first carrying-in-or-out level in a vertical row with the first transport device, transporting the article from the storage location at the first carrying-in-or-out level in the vertical row to a storage location at a second carrying-in-or-out level in a vertical row with the for-rack transport device, and by transporting the article from the storage location at the second carrying-in-or-out level in the vertical row with the second transport device. Also, an article can be delivered from the second transport device to the first transport device by transporting the article to a storage location at a second carrying-in-or-out level in a vertical row with the second transport device, transporting the article from the storage location at the second carrying-in-or-out level in the vertical row to a storage location at a first carrying-in-or-out level in a vertical row with the for-rack transport device, and by transporting the article from the storage location at the first carrying-in-or-out level in the vertical row with the first transport device. Thus, articles can be transferred between the first transport device and the second transport device by making use of the storage rack and the for-rack transport device.

[Industrial Applicability]

The technology in accordance with the present disclosure may be applicable to an article transport facility including an article transport vehicle for transporting an article, and a storage rack for storing articles.

What is claimed is:

1. An article transport facility comprising:
    an article transport vehicle configured to transport an article;
    a storage rack configured to store articles;
    a for-rack transport device provided separately from the article transport vehicle and configured to transport an article;
    wherein the article transport vehicle is configured to travel along one or more rails with the article transport vehicle suspended from the one or more rails which are suspended from, and supported by, a ceiling,
    wherein the storage rack is suspended from, and supported by, the ceiling such that the storage rack is located adjacent to the one or more rails, the storage rack having storage locations each configured to store an article, the storage locations being arranged in one or more vertical rows and at a plurality of levels with one level located above another along a vertical direction,
    wherein the for-rack transport device is located on an opposite side from the one or more rails with respect to the storage rack,
    wherein, with a lowest level of the plurality of levels in at least one of the one or more vertical rows of storage locations being each designated as a carrying-in-or-out level in a corresponding vertical row, and with at least one level of the plurality of levels in at least one of the one or more vertical rows that is not a carrying-in-or-out level being each designated as a storage level in a corresponding vertical row,
    the article transport vehicle is configured to be capable of transferring an article to any storage location at any carrying-in-or-out level in any of the one or more vertical rows, and is configured to be incapable of transferring an article to any storage location at any storage level in any of the one or more vertical rows,
    wherein the for-rack transport device is configured to be capable of transporting an article between any storage location at any carrying-in-or-out level in any of the one or more vertical rows and any storage location at any storage level in any of the one or more vertical rows,
    wherein the for-rack transport device is suspended from, and supported by, the ceiling, and
    wherein, with an extending direction being defined as a direction along which the one or more rails extend, and with a perpendicular direction being defined as a direction that is perpendicular to the extending direction as seen along the vertical direction,
    the article transport vehicle includes a travel portion configured to travel on, and along, the one or more rails, a relay portion which is supported by the travel portion and is capable of being moved along the perpendicular direction with respect to the travel portion, and an article support portion which is supported by the relay portion and configured to support an article.

2. The article transport facility as defined in claim 1, wherein
    at each of the plurality of levels, the storage rack includes a plurality of storage locations arranged along an extending direction along which the one or more rails extend, and
    the article transport vehicle is configured to be capable of transferring an article to the plurality of the storage locations arranged along the extending direction in the carrying-in-or-out level of the storage rack.

3. The article transport facility as defined in claim 1, wherein,
    with a storage level in any of the one or more vertical rows that is above, and adjacent to, a carrying-in-or-out level along the vertical direction being each defined as a subject storage level in a corresponding vertical row,
    a distance between a height associated with a carrying-in-or-out level and a height associated with a corresponding subject storage level is greater than a distance between two heights associated with respective storage levels that are adjacent to each other along the vertical direction.

4. The article transport facility as defined in claim 1, wherein
    the article support portion is an upper part support portion which is supported by the relay portion, and which is capable of being moved along the vertical direction with respect to the relay portion, and is configured to support an upper portion of an article,
    wherein the for-rack transport device includes a generally plate-shaped bottom support portion configured to support a bottom portion of an article from below, and an actuator configured to move the bottom support portion, and
    wherein the actuator moves the bottom support portion along the vertical direction and along the perpendicular direction.

5. The article transport facility as defined in claim 1, wherein
    with the one or more rails being one or more first rails, each carrying-in-or-out level in any of the one or more vertical rows being a first carrying-in-or-out level in a corresponding vertical row, and the article transport vehicle configured to travel along the one or more first rails being a first transport vehicle,
    the article transport facility further comprises one or more second rails that are suspended from, and supported by, the ceiling, in addition to the one or more first rails, and a second transport vehicle which is an article transport vehicle configured to travel along the one or more second rails,
    wherein the one or more second rails are so located to overlap with the one or more first rails as seen along the vertical direction in an area adjacent to the storage rack,
    wherein, with at least one level of the plurality of levels in at least one of the one or more vertical rows of storage locations being each designated as a first carrying-in-or-out level in a corresponding row, and at least one level of the plurality of levels in at least one of the one or more vertical rows of storage locations that is not a first carrying-in-or-out level being each designated as a second carrying-in-or-out level in a corresponding row, and each of the plurality of levels in any of the one or more vertical rows that is not a first carrying-in-or-out level or a second carrying-in-or-out level being designated as a storage level in a corresponding row,
    the second transport vehicle is configured to be capable of transferring an article to any storage location at any second carrying-in-or-out level in any of the one or more vertical rows, and is configured to be incapable of transferring an article to any storage location at any level in any of the one or more of the vertical rows that is not a second carrying-in-or-out level in any of the one or more vertical rows, and wherein the for-rack transport device is configured to be capable of transporting an article between any storage location at any first carrying-in-or-out level in any of the one or more vertical rows, any storage location at any second carrying-in-or-out level in any of the one or more vertical rows, and any storage location at any storage level in any of the one or more vertical rows.

6. An article transport facility comprising:

an article transport vehicle configured to transport an article;

a storage rack configured to store articles;

a for-rack transport device provided separately from the article transport vehicle and configured to transport an article;

wherein the article transport vehicle is configured to travel along one or more rails with the article transport vehicle suspended from the one or more rails which are suspended from, and supported by, a ceiling, wherein the storage rack is suspended from, and supported by, the ceiling such that the storage rack is located adjacent to the one or more rails, the storage rack having storage locations each configured to store an article, the storage locations being arranged in one or more vertical rows and at a plurality of levels with one level located above another along a vertical direction, wherein the for-rack transport device is located on an opposite side from the one or more rails with respect to the storage rack, wherein, with at least one level of the plurality of levels in at least one of the one or more vertical rows of storage locations being each designated as a carrying-in-or-out level in a corresponding vertical row, and with at least one level of the plurality of levels in at least one of the one or more vertical rows that is not a carrying-in-or-out level being each designated as a storage level in a corresponding vertical row, the article transport vehicle is configured to be capable of transferring an article to any storage location at any carrying-in-or-out level in any of the one or more vertical rows, and is configured to be incapable of transferring an article to any storage location at any storage level in any of the one or more vertical rows, wherein the for-rack transport device is configured to be capable of transporting an article between any storage location at any carrying-in-or-out level in any of the one or more vertical rows and any storage location at any storage level in any of the one or more vertical rows, wherein at each of the plurality of levels, the storage rack includes a plurality of storage locations arranged along an extending direction along which the one or more rails extend, and wherein the article transport vehicle is configured to be capable of transferring an article to the plurality of the storage locations arranged along the extending direction in the carrying-in-or-out level of the storage rack.

7. The article transport facility as defined in claim 6, wherein, with a storage level in any of the one or more vertical rows that is above, and adjacent to, a carrying-in-or-out level along the vertical direction being each defined as a subject storage level in a corresponding vertical row, a distance between a height associated with a carrying-in-or-out level and a height associated with a corresponding subject storage level is greater than a distance between two heights associated with respective storage levels that are adjacent to each other along the vertical direction.

8. The article transport facility as defined in claim 6, wherein the for-rack transport device is suspended from, and supported by, the ceiling.

9. The article transport facility as defined in claim 6, wherein, with an extending direction being defined as a direction along which the one or more rails extend, and with a perpendicular direction being defined as a direction that is perpendicular to the extending direction as seen along the vertical direction, the article transport vehicle includes a travel portion configured to travel on, and along, the one or more rails, a relay portion which is supported by the travel portion and is capable of being moved along the perpendicular direction with respect to the travel portion, and an upper part support portion which is supported by the relay portion, and which is capable of being moved along the vertical direction with respect to the relay portion, and is configured to support an upper portion of an article, wherein the for-rack transport device includes a generally plate-shaped bottom support portion configured to support a bottom portion of an article from below, and an actuator configured to move the bottom support portion, and wherein the actuator moves the bottom support portion along the vertical direction and along the perpendicular direction.

10. The article transport facility as defined in claim 6, wherein with the one or more rails being one or more first rails, each carrying-in-or-out level in any of the one or more vertical rows being a first carrying-in-or-out level in a corresponding vertical row, and the article transport vehicle configured to travel along the one or more first rails being a first transport vehicle, the article transport facility further comprises one or more second rails that are suspended from, and supported by, the ceiling, in addition to the one or more first rails, and a second transport vehicle which is an article transport vehicle configured to travel along the one or more second rails, wherein the one or more second rails are so located to overlap with the one or more first rails as seen along the vertical direction in an area adjacent to the storage rack, wherein, with at least one level of the plurality of levels in at least one of the one or more vertical rows of storage locations being each designated as a first carrying-in-or-out level in a corresponding row, and at least one level of the plurality of levels in at least one of the one or more vertical rows of storage locations that is not a first carrying-in-or-out level being each designated as a second carrying-in-or-out level in a corresponding row, and each of the plurality of levels in any of the one or more vertical rows that is not a first carrying-in-or-out level or a second carrying-in-or-out level being designated as a storage level in a corresponding row, the second transport vehicle is configured to be capable of transferring an article to any storage location at any second carrying-in-or-out level in any of the one or more vertical rows, and is configured to be incapable of transferring an article to any storage location at any level in any of the one or more of the vertical rows that is not a second carrying-in-or-out level in any of the one or more vertical rows, wherein the for-rack transport device is configured to be capable of transporting an article between any storage location at any first carrying-in-or-out level in any of the one or more vertical rows, any storage location at any second carrying-in-or-out level in any of the one or more vertical rows, and any storage location at any storage level in any of the one or more vertical rows.

11. An article transport facility comprising:

an article transport vehicle configured to transport an article;

a storage rack configured to store articles;

a for-rack transport device provided separately from the article transport vehicle and configured to transport an article;

wherein the article transport vehicle is configured to travel along one or more rails with the article transport vehicle suspended from the one or more rails which are suspended from, and supported by, a ceiling, wherein the storage rack is suspended from, and supported by, the ceiling such that the storage rack is located adjacent to the one or more rails, the storage rack having storage locations each configured to store an article, the storage locations being arranged in one or more vertical rows and at a plurality of levels with one level located above another along a vertical direction, wherein the for-rack transport device is located on an opposite side from the one or more rails with respect to the storage rack, wherein, with at least one level of the plurality of levels in at least one of the one or more vertical rows of storage locations being each designated as a carrying-in-or-out level in a corresponding vertical row, and with at least one level of the plurality of levels in at least one of the one or more vertical rows that is not a carrying-in-or-out level being each designated as a storage level in a corresponding vertical row, the article transport vehicle is configured to be capable of transferring an article to any storage location at any carrying-in-or-out level in any of the one or more vertical rows, and is configured to be incapable of transferring an article to any storage location at any storage level in any of the one or more vertical rows, wherein the for-rack transport device is configured to be capable of transporting an article between any storage location at any carrying-in-or-out level in any of the one or more vertical rows and any storage location at any storage level in any of the one or more vertical rows, wherein with the one or more rails being one or more first rails, each carrying-in-or-out level in any of the one or more vertical rows being a first carrying-in-or-out level in a corresponding vertical row, and the article transport vehicle configured to travel along the one or more first rails being a first transport vehicle, the article transport facility further comprises one or more second rails that are suspended from, and supported by, the ceiling, in addition to the one or more first rails, and a second transport vehicle which is an article transport vehicle configured to travel along the one or more second rails, wherein the one or more second rails are so located to overlap with the one or more first rails as seen along the vertical direction in an area adjacent to the storage rack, wherein, with at least one level of the plurality of levels in at least one of the one or more vertical rows of storage locations being each designated as a first carrying-in-or-out level in a corresponding row, and at least one level of the plurality of levels in at least one of the one or more vertical rows of storage locations that is not a first carrying-in-or-out level being each designated as a second carrying-in-or-out level in a corresponding row, and each of the plurality of levels in any of the one or more vertical rows that is not a first carrying-in-or-out level or a second carrying-in-or-out level being designated as a storage level in a corresponding row, the second transport vehicle is configured to be capable of transferring an article to any storage location at any second carrying-in-or-out level in any of the one or more vertical rows, and is configured to be incapable of transferring an article to any storage location at any level in any of the one or more of the vertical rows that is not a second carrying-in-or-out level in any of the one or more vertical rows, and wherein the for-rack transport device is configured to be capable of transporting an article between any storage location at any first carrying-in-or-out level in any of the one or more vertical rows, any storage location at any second carrying-in-or-out level in any of the one or more vertical rows, and any storage location at any storage level in any of the one or more vertical rows.

12. The article transport facility as defined in claim 11, wherein at each of the plurality of levels, the storage rack includes a plurality of storage locations arranged along an extending direction along which the one or more rails extend.

13. The article transport facility as defined in claim 11, wherein, with a storage level in any of the one or more vertical rows that is above, and adjacent to, a carrying-in-or-out level along the vertical direction being each defined as a subject storage level in a corresponding vertical row, a distance between a height associated with a carrying-in-or-out level and a height associated with a corresponding subject storage level is greater than a distance between two heights associated with respective storage levels that are adjacent to each other along the vertical direction.

14. The article transport facility as defined in claim 11, wherein the for-rack transport device is suspended from, and supported by, the ceiling.

15. The article transport facility as defined in claim 11, wherein, with an extending direction being defined as a direction along which the one or more rails extend, and with a perpendicular direction being defined as a direction that is perpendicular to the extending direction as seen along the vertical direction, the article transport vehicle includes a travel portion configured to travel on, and along, the one or more rails, a relay portion which is supported by the travel portion and is capable of being moved along the perpendicular direction with respect to the travel portion, and an upper part support portion which is supported by the relay portion, and which is capable of being moved along the vertical direction with respect to the relay portion, and is configured to support an upper portion of an article, wherein the for-rack transport device includes a generally plate-shaped bottom support portion configured to support a bottom portion of an article from below, and an actuator configured to move the bottom support portion, and wherein the actuator moves the bottom support portion along the vertical direction and along the perpendicular direction.

\* \* \* \* \*